United States Patent
Sakai et al.

(12)

(10) Patent No.: US 6,276,207 B1
(45) Date of Patent: Aug. 21, 2001

(54) SEMICONDUCTOR PHYSICAL QUANTITY SENSOR HAVING MOVABLE PORTION AND FIXED PORTION CONFRONTED EACH OTHER AND METHOD OF MANUFACTURING THE SAME

(75) Inventors: Minekazu Sakai, Kariya; Yukihiro Takeuchi, Nishikamo-gun; Inao Toyoda, Okazaki; Seiichiro Ishio, Kariya; Toshimasa Yamamoto, Bisai; Eishi Kawasaki, Kuwana; Minoru Murata, Kariya; Hiroshi Muto, Nagoya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/438,293

(22) Filed: Nov. 12, 1999

(30) Foreign Application Priority Data

Nov. 13, 1998 (JP) .................................................. 10-323748
Sep. 16, 1999 (JP) .................................................. 11-262319

(51) Int. Cl.$^7$ .................................................. G01P 15/00
(52) U.S. Cl. ..................................... 73/514.16; 73/514.32
(58) Field of Search ........................... 73/514.16, 514.32, 73/514.36

(56) References Cited

U.S. PATENT DOCUMENTS

| 5,421,956 | 6/1995 | Koga et al. . |
| 5,495,761 | 3/1996 | Diem et al. . |
| 5,503,017 | * 4/1996 | Mizukushi .................... 73/514.36 |
| 5,561,248 | 10/1996 | Negoro . |
| 5,563,343 | 10/1996 | Shaw et al. . |
| 5,610,335 | 3/1997 | Shaw et al. . |
| 5,616,523 | 4/1997 | Benz et al. . |
| 5,723,353 | 3/1998 | Muenzei et al. . |
| 5,744,719 | * 4/1998 | Werner ........................ 73/514.32 |
| 5,756,901 | * 5/1998 | Kurle et al. .......................... 73/777 |
| 5,959,208 | * 9/1999 | Offenberg et al. ............. 73/514.32 |
| 6,109,106 | * 8/2000 | Ferrari et al. .................. 73/514.32 |
| 6,133,059 | * 10/2000 | Werner ............................. 438/52 |

FOREIGN PATENT DOCUMENTS

| 0 591 554 | 4/1994 | (EP) . |
| 4-162779 | 6/1992 | (JP) . |
| 5-304303 | 11/1993 | (JP) . |
| 6-88838 | 3/1994 | (JP) . |
| 6-331648 | 12/1994 | (JP) . |
| 6-347474 | 12/1994 | (JP) . |
| 9-211022 | 8/1997 | (JP) . |

* cited by examiner

Primary Examiner—Richard A. Moller
(74) Attorney, Agent, or Firm—Pillsbury Winthrop LLP

(57) ABSTRACT

A semiconductor acceleration sensor, which prevents an adhesion of a movable portion to a fixed portion due to an electrostatic force generated during being handled. The acceleration sensor has a sensor portion and a handling portion. The sensor portion has a first semiconductor layer; a movable portion including a weight portion supported to the first semiconductor layer for moving in accordance with an acceleration externally applied thereto and movable electrodes integrally formed with the weight portion; and fixed electrodes having a detection surface confronted to a detection surface of the movable electrodes and supported to the first semiconductor layer. The handling portion is to be contacted during being handled, and is provided at surrounding portion of the sensor portion with a trench interposed therebetween. The sensor portion is electrically insulated from the handling portion by the trench.

5 Claims, 12 Drawing Sheets

SEMICONDUCTOR PHYSICAL QUANTITY SENSOR HAVING MOVABLE PORTION AND FIXED PORTION CONFRONTED EACH OTHER AND METHOD OF MANUFACTURING THE SAME

CROSS REFERENCE TO RELATED APPLICATION

This application is based upon Japanese Patent Application Nos. Hei. 10-323748 filed on Nov. 13, 1998 and Hei. 11-262319 filed on Sep. 16, 1999, the contents of which are incorporated herein by reference.

BACKGROUND OF THE INVENTION

1. Field of the Invention

This invention relates to a semiconductor physical quantity sensor, and particularly to a semiconductor physical quantity sensor in which a movable electrode and a fixed electrode confronting to the movable electrode are formed by forming a trench in a semiconductor layer of a semiconductor substrate, and a method of manufacturing the same.

2. Related Art

This kind of a semiconductor physical quantity sensor has proposed in WO 93/22690 (or EP 591554A1), or JP-A-9-211022, for example. These documents disclose a capacitor detection type semiconductor acceleration sensor, which has a support portion formed by a elastic beam supported by an anchor portion fixed to a semiconductor substrate, a weight portion connected to the support portion, a movable portion consists of a comb-shape movable electrode integrally formed with the weight portion, and a comb-shape fixed electrode fixed to the semiconductor substrate so as to confront to the movable electrode.

In this kind of semiconductor acceleration sensor, a structure in which the movable portion and the fixed electrode are released is formed by using photolithography technique and by etching a semiconductor layer of the semiconductor substrate in general.

According to this semiconductor acceleration sensor, since one of two intervals between detection surface of the movable electrodes and detection surface of the fixed electrodes is increased and another interval is decreased, the sensor can detect an acceleration to be applied thereto by differentially detecting a change of capacitance due to the interval changes.

However, this kind of semiconductor sensor having such a structure, the movable portion may adhere to the semiconductor substrate or the fixed portion such as the fixed electrode. This adhesion may be caused by van der Waals bonding or hydrogen bonding generated at a contacted portion because this structure is made of a semiconductor. It is found that this adhesion is caused by the following factors.

The first factor is an electrostatic force generated during a handling the semiconductor sensor. In the case such the semiconductor sensor having the structure made by the photolithography is handed with a jig, the jig needs to contact with somewhere of the semiconductor sensor. When the jig contacts with the semiconductor sensor, a potential difference occurs between the movable portion and the fixed portion by being partly charged. As a result, the movable portion confronted the fixed portion is attracted to and contacted to the fixed portion by the electrostatic force, and is stuck there.

The second factor is a surface tension of an etchant or detergent used in manufacturing the semiconductor sensor. In general, after an etching (release etching) for releasing the movable portion from the fixed portion is performed, the semiconductor sensor is soaked in liquid such as pure water so as to substitute the etchant with the pure water, and then the semiconductor sensor is dried (evaporated) at a room temperature. In this step, the movable portion and the fixed portion are attracted each other by the surface tension of the liquid stagnated therebetween.

The adhesion due to the surface tension is likely to occur between a detection surface of the movable electrode and a detection to surface of the fixed electrode confronted with a small interval (detection interval), or between a weight portion and the fixed portion confronted to the weight portion in moving direction. The reason will be explained hereinafter.

Because it is effective to enlarge a detection capacitance to improve a sensibility of the capacitance type sensor, it is preferable to enlarge a confront area between the movable electrode and the fixed electrode or to reduce an interval therebetween. Furthermore, it is effective to lower a spring constant in a detection direction or a direction in which the interval between the movable electrode and the fixed electrode changes to enlarge a displacement due to the acceleration (physical quantity). That is, the spring constant in the detection direction of the movable electrode or weight portion is lowered.

It is known that an attraction force due to the surface tension of the liquid stagnated between the confronted surfaces depends on an area to be contacted with the liquid and the interval therebetween. On the contrary, the liquid is likely to finally stagnate at a narrow portion due to capillary phenomenon, as the evaporation of the liquid proceeds. Therefore, since the interval between the movable electrode and the fixed electrode is small, these electrode may be stuck each other, because the liquid is likely to stagnate therebetween, the area contacting with the liquid is large enough to cause a large surface tension, and the spring constant is small. Furthermore, since the weight portion also has a small spring constant, the weight portion is likely to adhere a confronted portion by the surface tension. In other words, the movable portion and the fixed portion are likely to adhere each other as the sensibility to be required is increased.

The third factor is an excessive shock (acceleration) externally applied to the semiconductor sensor when the sensor is dropped down during being handled, for instance. When the excessive shock is applied to the semiconductor sensor in a direction that movable portion moves, the movable electrode adheres to the fixed electrode at a portion where the detection interval is small. Here, the bonding described the above is generated at the stuck portion. Although the movable portion may be released from the fixed portion by applying a restore (spring) force, which is larger than the bonding force for restoring the structure, it is not preferable to do so because it may decrease the displacement due to the physical quantity and decrease the sensibility.

SUMMARY OF THE INVENTION

This invention has been conceived in view of the background thus far described and its first object is to prevent an adhesion of a movable portion to a fixed portion due to an electrostatic force generated during being handled.

Its second object is to prevent an adhesion of a movable portion to a fixed portion due to a surface tension of liquid during manufacture.

Its third object is to prevent an adhesion of a movable portion to a fixed portion due to an excessive force being externally applied thereto.

According to the present invention, a handling portion is formed on the semiconductor substrate by being insulated from the sensor portion by an insulation portion. By contacting a jig with only the handling portion, it can prevent the sensor portion from being charged so that an adhesion due to an electrostatic force generated during the handling can be prevented.

According to another aspect of the present invention, at least one of the movable electrode and the fixed electrode is formed so that an interval between the non-detection surface and a surface confronted to this non-detection surface is smaller than the detection interval. In the case liquid is used in a manufacturing step of this structure, the liquid is likely to finally stagnate at the interval between the non-detection surface and a surface confronted to this non-detection surface smaller than the detection interval, but not detection interval. When the liquid does not stagnate at detection interval having a large area, a tensile stress due to a surface tension generated by the evaporation also reduces. Therefore, it can precisely prevent the adhesion, because the total area where the tensile stress due to the surface tension is to be applied can be largely reduced so that an adhesion due to the surface tension at the detection interval can be prevented.

According to the other aspect of the present invention, the support portion is movable to a predetermined direction and has a non-detection surface at a direction other than the predetermined direction, and the support portion is formed so that an interval between the non-detection surface and a surface confronted to this non-detection surface is smaller than any other interval defined by other portions. The liquid remained between the weight portion and confronted portion is likely to finally stagnate at the small interval. Therefore, it can between the non-detection surface and a surface confronted to this non-detection surface smaller than the detection interval, but not detection interval. Therefore, it can precisely prevent the adhesion due to a surface tension of the liquid remained in moving direction.

According to the other aspect of the present invention, a stopper supported to the semiconductor substrate is provided at a moving direction of the movable portion so as to confront to the movable portion with an interval smaller than the detection interval interposed therebetween. When an excessive shock (acceleration) is externally applied to the semiconductor physical quantity sensor, the movable portion is stopped by colliding with the stopper. Therefore, both the electrodes do not contact with each other at the narrow detection interval so that the adhesion can be prevented.

According to the other aspect of the present invention, the substitute liquid remained on the structure is evaporated with heating the structure. Since the surface tension of the substitute liquid at high temperature is smaller than that at room temperature, it can prevent an adhesion.

According to the other aspect of the present invention, the structure is soaked into a heated substitute liquid to substitute the etchant with the substitute liquid, and being taken out from the heated substitute liquid to evaporate the substitute. Since the surface tension of the substitute liquid at high temperature is smaller than that at room temperature, it can prevent an adhesion.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

[First Embodiment]

Figure 1A:
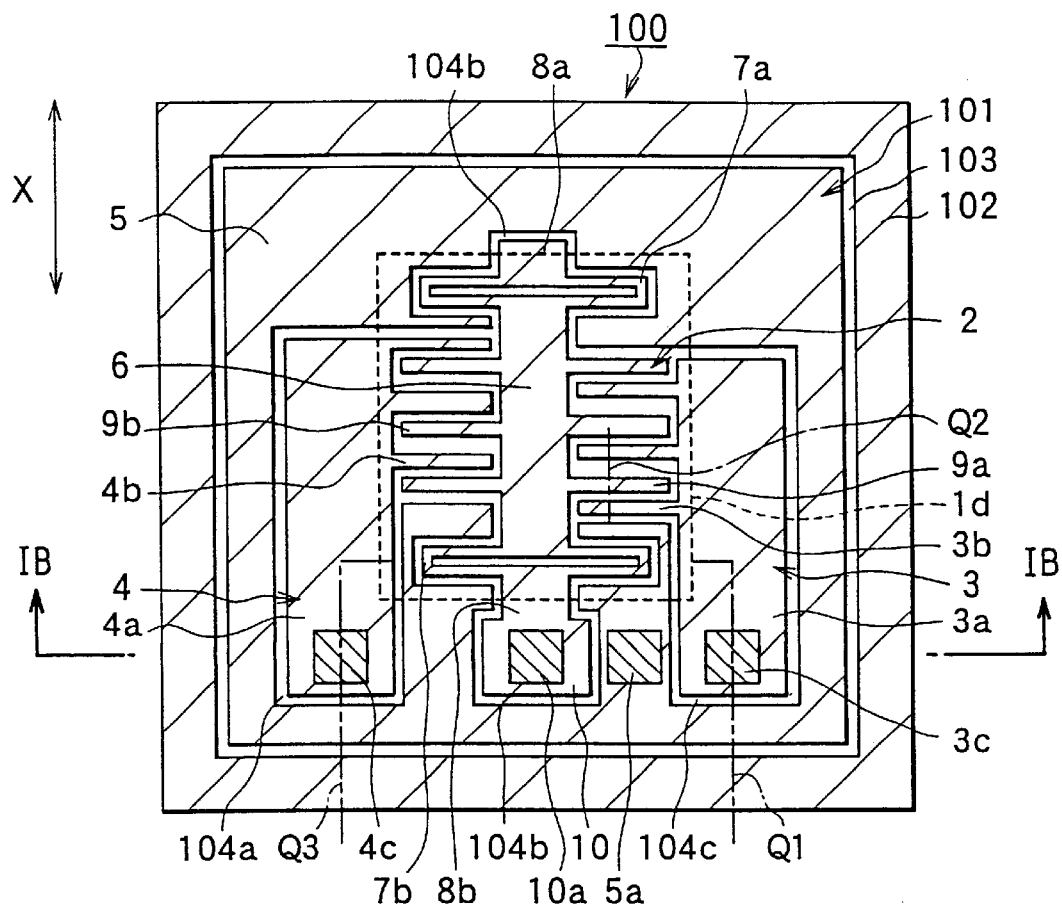
FIG. 1A is a plan view of a semiconductor acceleration sensor of a first embodiment according to the present invention.

This embodiment is to prevent an adhesion due to an electrostatic force generated during being handled. FIG. 1A shows a plan view of a semiconductor acceleration sensor 100 as the semiconductor physical quantity sensor, and FIG. 1B shows a sectional view taken along a line IB—IB in FIG. 1A.

Figure 2:
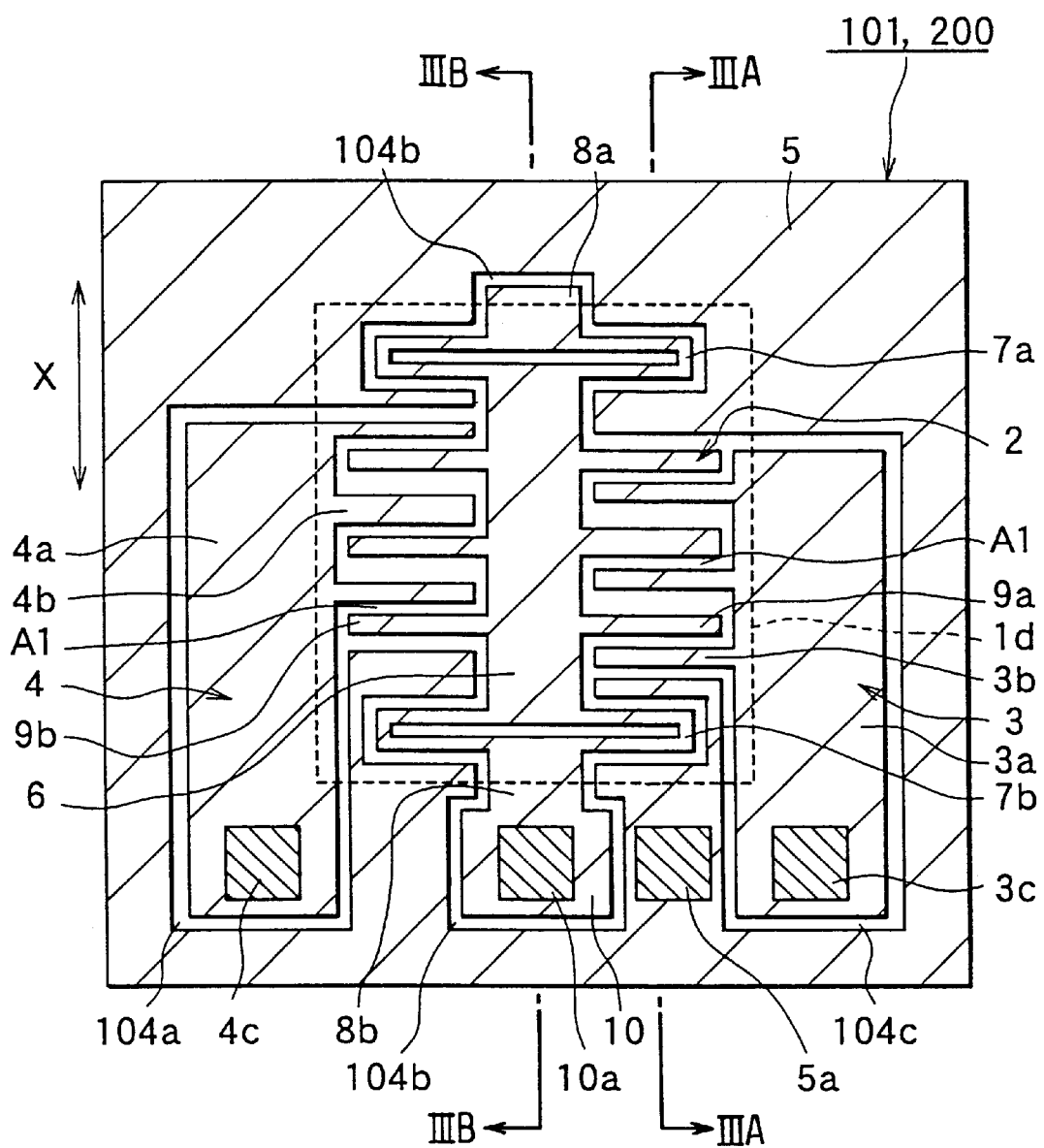
FIG. 2 is a plan view illustrating a sensor portion of the semiconductor acceleration sensor of the first embodiment.
Figure 3A:
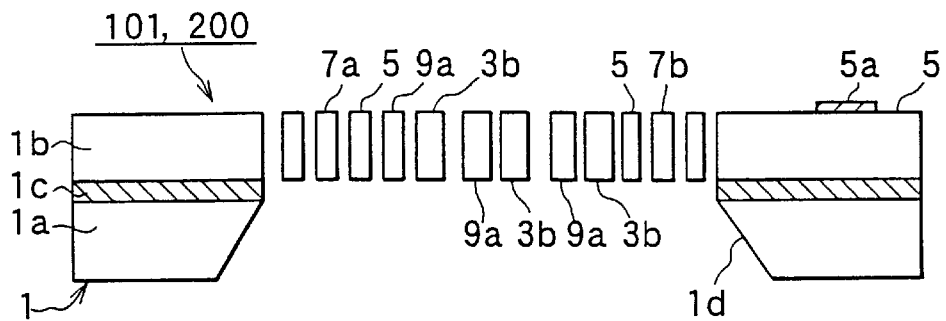
FIGS. 3A and 3B are sectional views taken along lines IIIA—IIIA and IIIB—IIIB, respectively, in FIG. 2.
Figure 3B:
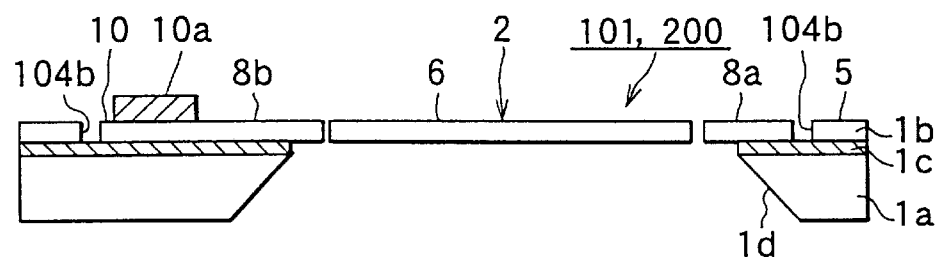

FIG. 2 is an enlarged plan view of a sensor portion 101 of the semiconductor acceleration sensor 100. FIGS. 3A and 3B show sectional views taken along lines IIIA—IIIA and IIIB—IIIB in FIG. 2. Here, hatched portions in FIGS. 1A and 2 do not show section, but is for facilitating recognition of each element.

Figure 1B:
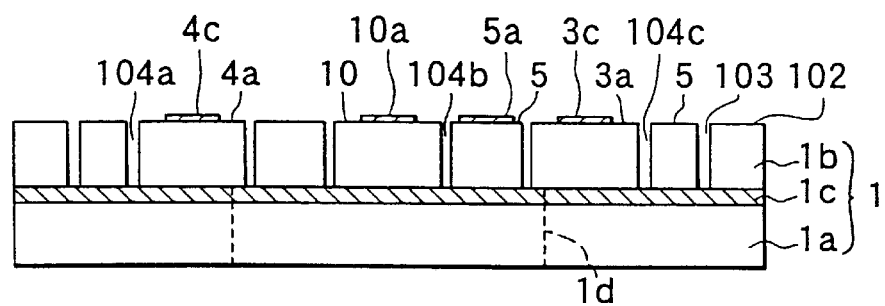
FIG. 1B is a sectional view taken along a line IB—IB in FIG. 1A.

As shown in FIG. 1B, the semiconductor acceleration sensor 100 is formed by performing a micro-machine process using a semiconductor manufacturing technique to a rectangular SOI (Silicon On Insulator) substrate 1 having a first semiconductor layer 1a (semiconductor substrate), a second semiconductor layer 1b and an insulation layer 1c disposed between the first semiconductor layer 1a and the second semiconductor layer 1b. The second semiconductor layer 1b is divided into the sensor portion 101 and a handling portion 102 electrically insulated from the sensor portion 101 by a rectangular trench 103.

The handling portion 102 is a portion where a jig is to be contacted when the semiconductor acceleration sensor 100 is handled, and is electrically insulated from the sensor portion 101, which positions inside of the handling portion 102, by the trench (insulation portion) 103 including air and an insulation layer 1c. The trench isolating the second semiconductor layer 1b may formed deeply enough to reach the insulation layer 1c.

Next, the sensor portion 101 will be explained with reference to FIGS. 2, 3A and 3B. The sensor portion 101 is provided with a movable portion (beam structure) 2 formed by the second semiconductor layer 1b, a pair of fixed electrode structures 3, 4, and a surrounding portion 5 surrounding each portions 2–4. Each portions 2–5 is separated each other by insulating with trenches 104a, 104b and 104c.

The first semiconductor layer 1a and the insulation layer 1c of the SOI substrate 1, at which the movable portion 2 of the sensor portion 101 and the pair of the fixed electrode structures 3, 4 are to be formed, is partly removed so that the second semiconductor layer 1b is exposed. The exposed portion constructs an opening portion 1d of the first semiconductor layer 1a. Here, impurities are previously diffused to a monocrystalline silicon constructing the movable portion 2 and the fixed electrode structures 3, 4 so as to lower its resistivity.

The movable portion 2 has a structure in which both ends of the rectangular weight portion 6 are integrally connected to anchor portions 8a, 8b via support portions 7a, 7b, respectively. The anchor portions 8a, 8b are supported on regions confronted each other in the first semiconductor layer 1a via the insulation layer 1c. Thus, the weight portion 6 and the support portions 7a, 7b confront to the opening portion 1d of the first semiconductor layer 1a.

Each the support portions 7a, 7b forming a beam-shape has a spring function to move in a direction perpendicular to a longitudinal direction of the beam. The support portions 7a, 7b having the spring function enable the weight portion 6 to move in X-direction when an acceleration including X-direction component is applied to the weight portion 6, and to restore to the initial position in accordance with disappearance of the acceleration.

The movable portion 2 is provided with plural pairs of (e.g. three pairs of) movable electrodes 9a, 9b integrally formed to both sides of the weight portion 6 so as to project to a direction perpendicular to the weight portion 6. The movable electrodes 9a, 9b also confront the opening portion 1d of the first semiconductor layer 1a. Furthermore, these movable electrodes 9a, 9b are formed in rectangular beam-shapes.

A movable electrode wire portion 10 is formed on the first semiconductor layer 1a with the insulation layer 1c interposed therebetween. The movable electrode wire portion 10 is integrally connected to the one anchor portion 8b of the movable portion 2. An electrode pad 10a for wire binding made of such as aluminum is formed on a predetermined position of the movable electrode wire portion 10.

The fixed electrode structure 3 is provided with a fixed electrode wire portion 3a (support portion) fixed to the first semiconductor layer 1a with the insulation layer 1c interposed therebetween and confronted to the weight portion 6, and plural (e.g. three) fixed electrodes 3b arranged in parallel to the one side of the movable electrode 9a with a predetermined detection interval (detection gap) A1 therebetween. The fixed electrode wire portion 3a and the fixed electrodes 3b are integrally formed so that each fixed electrode 3b is supported to the fixed electrode wire portion 3a from one side. Thus, the fixed electrode 3b confronts the opening portion 1d of the first semiconductor layer 1a.

The fixed electrode structure 4 is provided with a fixed electrode wire portion 4a (support portion) fixed to the first semiconductor layer 1a with the insulation layer 1c interposed therebetween and confronted to the weight portion 6, and plural (e.g. three) fixed electrodes 4b arranged in parallel to the one side (opposite side of the detection interval A1 for the movable electrode 9a) of the movable electrode 9b with a predetermined detection interval (detection gap) therebetween. The fixed electrode wire portion 4a and the fixed electrodes 4b are integrally formed so that each fixed electrode 4b is supported to the fixed electrode wire portion 4a from one side. Thus, the fixed electrode 4b confronts the opening portion 1d of the first semiconductor layer 1a.

Here, each the fixed electrodes 3b, 4b is formed in a rectangular beam-shape. Electrode pads 3c, 4c for wire bonding made of such as aluminum are formed on predetermined positions of the fixed electrode wire portions 3a, 4a.

Figure 4:
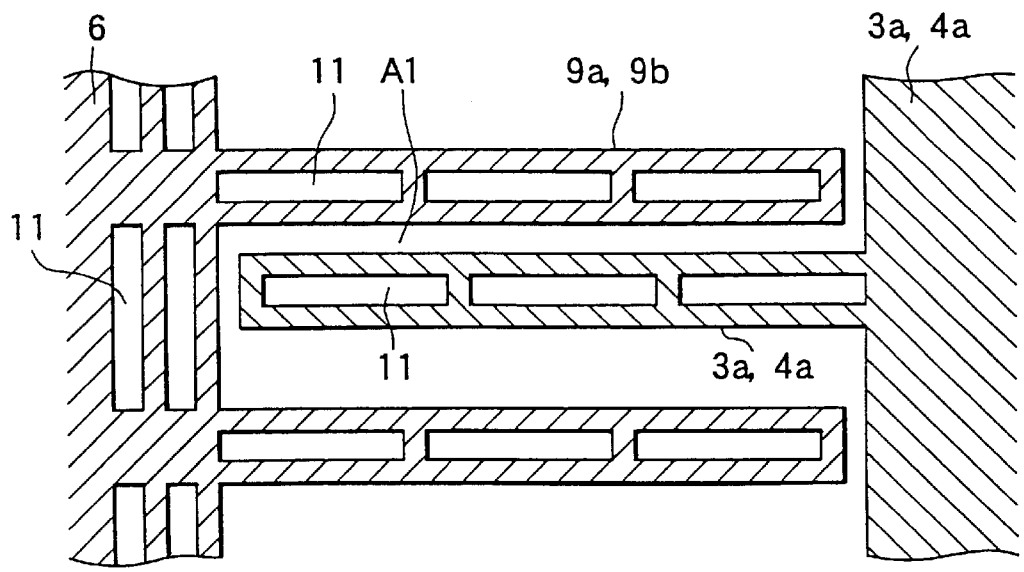
FIG. 4 is an enlarged plan view of an electrode portion of the semiconductor acceleration sensor of the first embodiment.

As shown in FIG. 4, although not-shown in FIGS. 1A–3B, plural rectangular through holes 11 boring from the opening portion 1d side to the opposite side are formed in the weight portion 6, the movable electrodes 9a, 9b and the fixed electrodes 3b, 4b. In this way, the weight portion 6, the movable electrodes 9a, 9b and the fixed electrodes 3b, 4b are formed in so-called Rahmen (rigid-frame) structure in which plural rectangular frames are combined each other. As a result, the movable portion 2 can be lightened and can improve distortion stiffness.

Here, an electrode pad 5a for wire binding made of such as aluminum is formed on a predetermined position of the surrounding portion 5. The electrode pad 5a maintains an amount of electric charge in the surrounding portion 5.

According to the semiconductor acceleration sensor 100 constructed the above, when the movable portion 2 received acceleration in a detection direction, the weight portion 6 moves to the X-direction in FIG. 2 so that one of the intervals between the detection surface of the movable electrode 9a and the detection surface of the fixed electrode 3b, and between the detection surface of the movable electrode 9b and the detection surface of the fixed electrode 4b increases, and another of them decreases.

Here, since a first capacitor is formed between the movable electrode 9a and the fixed electrode 3b and a second capacitor is formed between the movable electrode 9b and the fixed electrode 4b, each capacitance of the first and the second capacitors differentially changes in accordance with movement of the movable electrodes 9a and 9b as a result of application of the acceleration including X-direction in FIG. 2 component to the weight portion 6. The acceleration can be detected by taking out the changes of the capacitances through the electrode pads 3c, 4c and 10a.

Next, a method of manufacturing the semiconductor acceleration sensor 100 constructed the above will be explained hereinafter with reference to FIGS. 5A through 5H. Here, FIG. 5H schematically shows a partial sectional model of the semiconductor acceleration sensor 110 (for convenience of the explanation, a sectional model in which each sectional view shown as chain lines Q1, Q2, Q3 in FIG. 1 are combined). FIGS. 5A through 5G show schematic sectional views of such the partial sectional model.

Figure 5A:
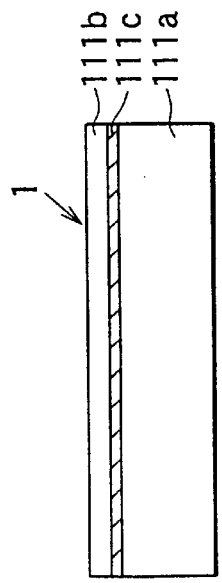
FIGS. 5A through 5H are sectional views illustrating each step of a method of manufacturing the semiconductor acceleration sensor of the first embodiment.

As shown in FIG. 5A, an SOI substrate 1 is provided. The SOI substrate 1 has a monocrystalline silicon wafer 111a (semiconductor substrate) as the first semiconductor layer 1a to be a base, and a monocrystalline silicon thin film 111b as the second semiconductor layer 1b formed on the monocrystalline silicon wafer 111a with a silicon oxide film 111c (insulation layer 1c) as a sacrificial layer interposed therebetween.

The monocrystalline wafer 111a has a surface orientation of (100), a thickness of at least approximately 300 μm, and a low impurity concentration. The monocrystalline silicon thin film 111b also has a surface orientation of (100), and a thickness of, for example, approximately 1 μm. Impurities such as phosphorus are previously implanted to and diffused to the monocrystalline silicon thin film 111b with a high concentration (approximately $1 \times 10^{19}$ cm$^{-3}$ or more) so as to reduce a resistivity and to make an ohmic contact with the electrode pads 3c, 4c, 5a and 10a.

Figure 5B:
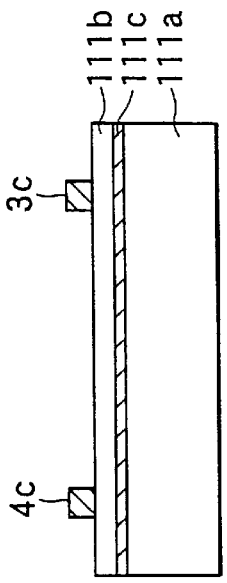

Next, as shown in FIG. 5B, an electrode pad forming step is performed to form the electrode pads 3c, 4c, 5a and 10a. In this step, after aluminum is deposited on the whole surface of the monocrystalline silicon thin film 111b with, for example, approximately 1 μm, the aluminum film is patterned by using a photolithography technique and an etching technique. As a result, the electrode pads 3c, 4c, 5a and 10a (5a and 10a are shown in FIG. 1) are formed. In this step, anneal may be performed to the SOI substrate 1 so that the electrode pads 3c, 4c, 5a and 10a can make the ohmic contact.

Figure 5C:
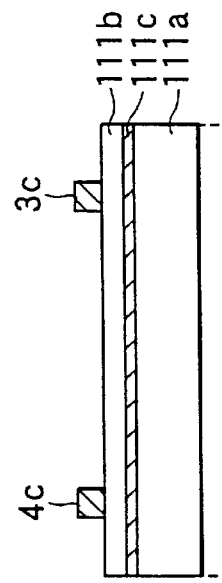

As shown in FIG. 5C, a size adjusting step is performed. In this step, the thickness of the monocrystalline silicon wafer 111a is adjusted to, for example, 300 μm by cutting and polishing a surface (opposite surface of the insulation layer 1c) of the monocrystalline silicon wafer 111a. After that, a mirror finish is performed to the processed surface. Here, the reason to thin down the monocrystalline silicon wafer 111a to 300 μm is, as described in detail in later, to reduce an etching depth during forming the opening portion 1d by using an isotropic etching and further to prevent an enlargement of a chip design size caused by the isotropic etching.

Figure 5D:
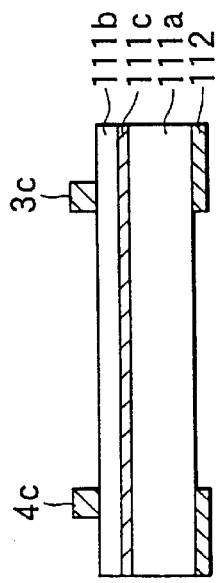

Next, as shown in FIG. 5D, a mask forming step is performed. In this step, a silicon nitride film is deposited on the whole surface of the monocrystalline silicon wafer 111a (mirror surface) by, for example, a plasma CVD (Chemical Vapor Deposition) method to have a thickness of approximately 0.5 μm. After that, the silicon nitride film is patterned by using the photolithography technique and the etching technique so that a mask 112a, which is used for forming the opening portion 1d by etching is formed.

Figure 5E:
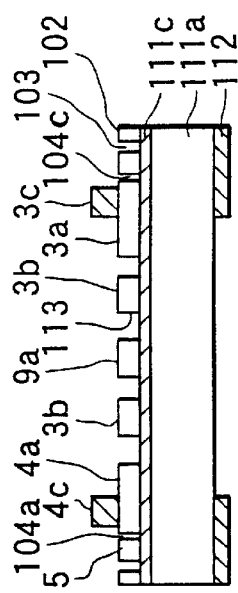

After that, as shown in FIG. 5E, a trench forming step is performed. In this step, a not-shown resist as a mask having an anti dry etching characteristic is formed on the monocrystalline silicon thin film 111b, electrode pads 3c, 4c, 5a and 10a. Next, a trench 113 reaching the silicon oxide film 11c is formed in the monocrystalline silicon thin film 111b by performing an isotropic dry etching in a dry etching apparatus by using the resist as the mask.

At the same time, the trench 103 as the insulation portion for isolating and electrically insulating the sensor portion 101 from the handling portion 102 is formed. In other words, the monocrystalline silicon thin film 111b is divided into the handling portion 102 and the sensor portion 101 in which the movable portion 2, the fixed electrode structures 3, 4 and the surrounding portion 5 are to be formed.

Figure 5F:
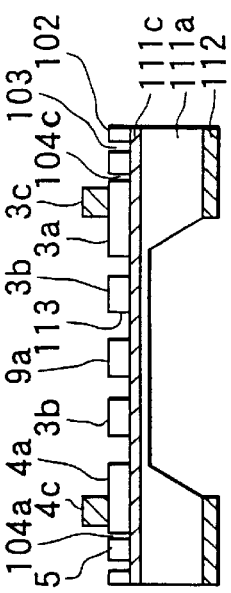

Next, as shown in FIG. 5F, a first etching step is performed. In this step, the monocrystalline silicon wafer 111a is selectively etched from the surface side (opposite surface of the silicon oxide film 111c) by using the mask 112 and, for example, KOH solution. Here, when such the etching is advanced to the silicon oxide film 111c, the silicon oxide film 111c may be broken due to a pressure of the etchant so that the monocrystalline silicon thin film 111b may be also broken. Therefore, the etching time is controlled so that the etching may not advance to the silicon oxide film 111c.

The etching time can be controlled by calculating based on a thickness of the monocrystalline silicon wafer 111a and an etching rate of the etchant (KOH). In this embodiment, the etching time is controlled so that the thickness of the monocrystalline silicon wafer 111a is set to approximately 10 μm. Although it is not shown in Figures, the surface side of the SOI substrate 1 is covered with a resist before the first etching step, and the resist is removed after the first etching step, for instance.

Figure 5G:
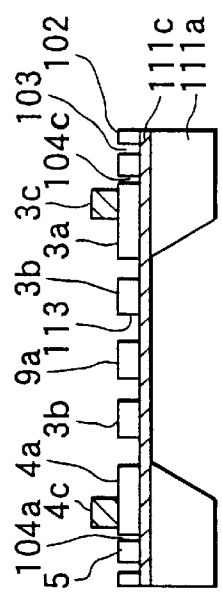
Figure 5H:
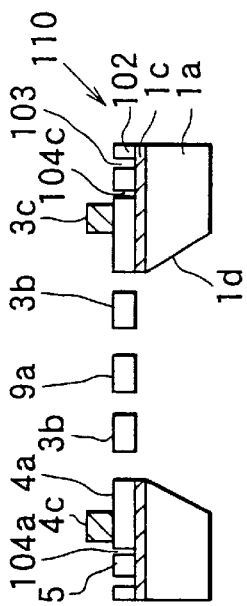

Next, as shown in FIG. 5G, a second etching step is performed. In this step, a dry etching is performed to the surface side of the monocrystalline silicon wafer 111a in a plasma etching apparatus so as to remove a part of the monocrystalline silicon wafer 111a, which is remained on the silicon oxide film 111c with a thickness of approximately 10 μm during the first etching step. As a result, a back surface (bottom surface) of the silicon oxide film 111c is exposed. Here, the mask 112 is also removed in this dry etching.

Next, as shown in FIG. 5H, a third etching step (a release step) is performed. In this step, the silicon oxide film 111c is removed by etching using HF-based etchant. As a result of the third etching step, the opening portion 1d is formed, and the weight portion 6, the support portions 7a, 7b, the movable electrodes 9a, 9b of the movable portion 2 are released (Here, the weight portion 6, the support portion 7a, the movable electrode 9b are not shown in FIG. 5H).

At the same time, the fixed electrode structures 3, 4, the fixed electrodes 3b, 4b are also released so that they are supported to the fixed electrode wire portions 3a, 4a from one ends like a cantilever (Here, the fixed electrode 4b is not shown in FIG. 5H). In this way, the structure 110, in which the movable portion 2 and the fixed electrode structures 3, 4 are released, is formed at the third etching step.

After the third etching step, the structure 110 is soaked into liquid (substitute liquid) such as ultrapure water to substitute the etchant with the liquid. Next, an evaporating step in which the structure 110 is dried and evaporated at a room temperature is performed. Finally, a dicing step, in which the SOI substrate 1 is diced into a predetermined sensor chip shape, is performed so that the semiconductor acceleration sensor 100 is completed.

Here, when the sensor chip is handled, it needs to touch somewhere of the chip. In this time, the sensor structure or a portion confronting the movable portion 2 may be charged with the electricity so that the portions may cause a sticking by the electrostatic force.

However, according to this embodiment, the semiconductor acceleration sensor 100 has the trench 103 as the insulation portion to electrically insulate the handling portion 102, which is to be touched during being handled, from the sensor portion 101. Therefore, there may be no electric influence when only the handling portion 102 is contacted (touched) by the jig during the handling. Therefore, because each confronted portion at the sensor portion 101 can be set equal potential, it can prevent the sensor portion 101 from being charged and can prevent adhesion due to the electrostatic force generated during the handling.

Especially, in the sensor chip handling step, since there are many tools (e.g., a pincette, a vacuum pyramid collet) to contact to a peripheral portion of the ship, it is effective to form the handling portion 102 to the peripheral (surrounding or outer side) portion of the sensor. In this embodiment, since the handling portion 102 is formed at the whole surrounding portion 5 of the sensor portion 101, it can handle the ship from any direction. Therefore, it is effective to perform a handling method in which the chip is held with the surrounding portion of the sensor ship.

According to this embodiment, since the sensor portion 101 and the handling portion 102 are formed from the second semiconductor layer 1b, which is provided on one surface of the first semiconductor layer 1a as the semiconductor substrate, and the both portions 101 and 102 are electrically insulated each other by the trench 103 as the insulation portion for dividing the second semiconductor layer 1b, the both portions 101 and 102 can be made of the same material. Thus, the semiconductor acceleration sensor 100 can become simple structure.

Furthermore, according to this embodiment, the sensor portion 101, the trench 103 and the handling portion 102 are formed at the same step by etching the monocrystalline silicon thin film 111b corresponding to the second semiconductor layer 1b at the trench forming step. Therefore, this structure can be simply formed without increasing the steps.

Figure 6:
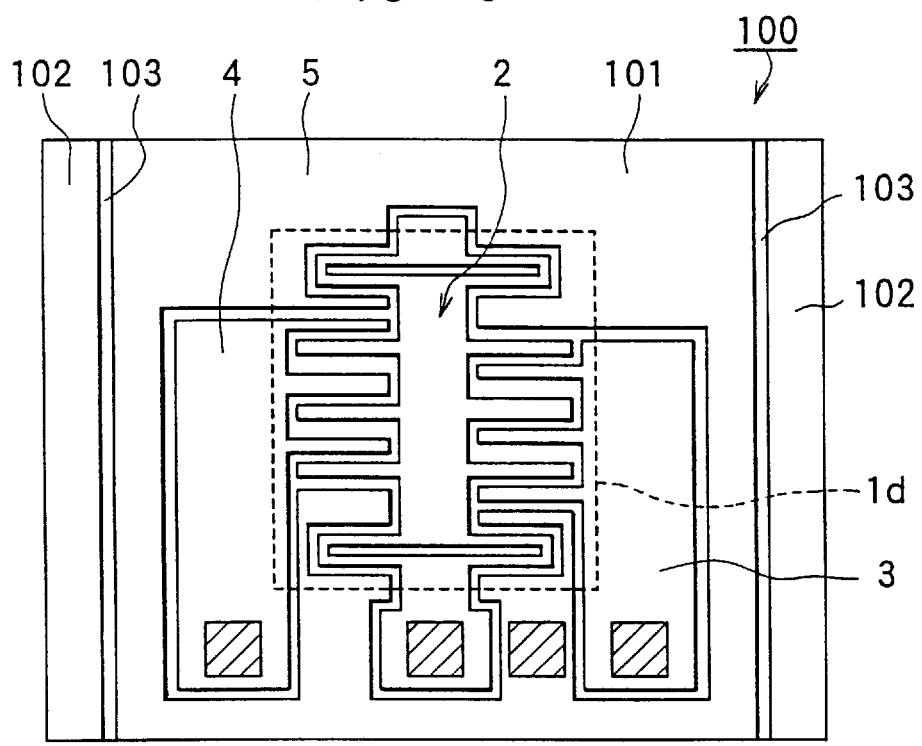
FIG. 6 is a plan view of a modified semiconductor acceleration sensor of the first embodiment.

Here, in this embodiment, the handling portion 102 may be arranged at the opposed two sides at the surrounding portion 5 of the sensor portion 101. In this case, it is effective to be applied to a handling method in which the opposed two side surfaces of the sensor ship are held. For example, as shown in FIG. 6, the handling portion 102 may be formed at both two oppose portions (both the fixed electrode structure sides 3, 4) on the first semiconductor layer 1a.

[Second Embodiment]

This embodiment is to prevent an adhesion due to a surface tension during the sensor manufacture.

The semiconductor acceleration sensor 200 of this embodiment is a modification of the first embodiment. That is, in this embodiment, the movable electrodes 9a, 9b, the fixed electrodes 3b, 4b, the weight portions 7a, 7b are modified, and the trench 103 and the handling portion 102 of the surrounding portion 5 of the sensor portion 101 are omitted. Therefore, according to the semiconductor sensor 200 of this embodiment, the sensor portion 101 shown in FIGS. 2, 3A and 3B is a basic structure as itself. The portions different from the first embodiment are mainly explained.

Figure 7A:
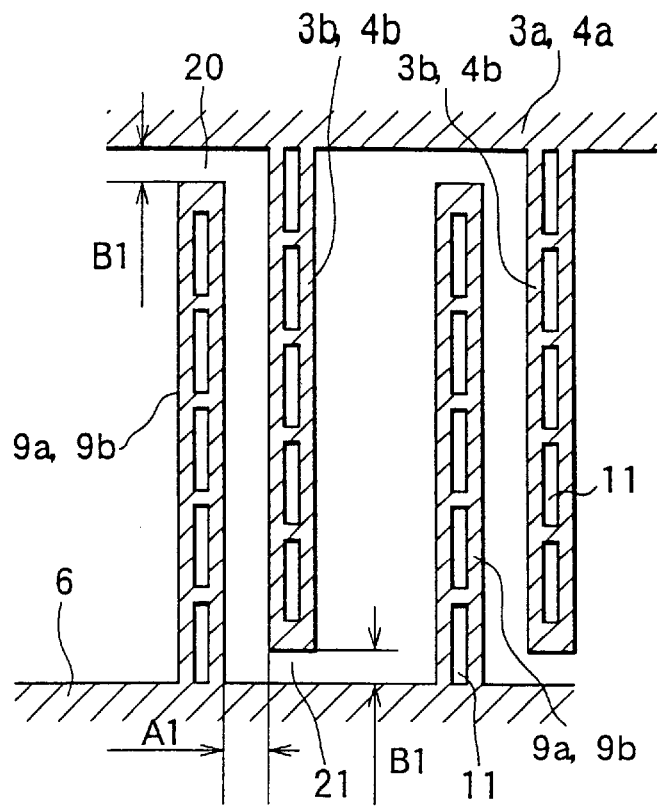
FIGS. 7A and 7B are enlarged plan views of a semiconductor acceleration sensor of a second embodiment.
Figure 7B:
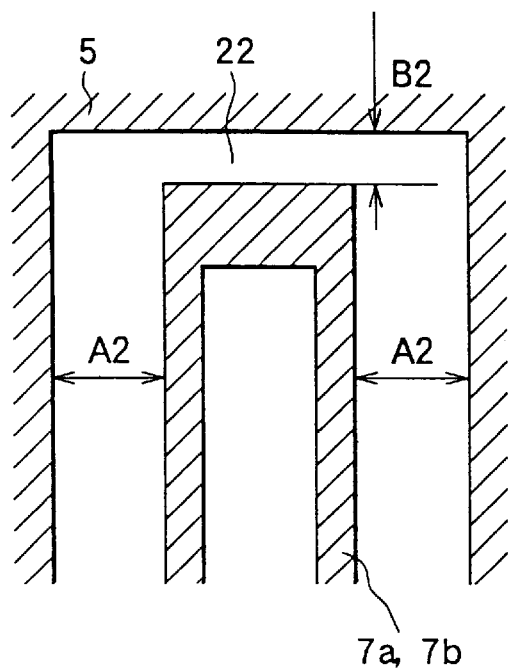

Here, FIG. 7A is an enlarged plan view of the movable electrodes 9a, 9b and the fixed electrodes 3b, 4b, and FIG. 7B is an enlarged plan view at a tip portion of the weight portions 7a, 7b.

In this embodiment, an arrow interval portion having an interval smaller than the detection interval is defined between a non-detection surface, which is the other surface than the detection surface, of at least one of the movable electrodes 9a, 9b and the fixed electrodes 3b, 4b, and a confronted surface confronting to the non-detection surface, as shown in FIG. 7a.

The movable electrodes 9a, 9b, which are formed in beam-shape projected and extended from the weight portion 6, and the movable electrodes 3b, 4b, which are formed in beam-shape projected and extended from the fixed electrode wire portion 3a, 4a confronted to the weight portion 6, are arranged so that each longitudinal direction surfaces of the beams are confronted with the detection interval A1 interposed therebetween. Here, the narrow interval portion 20, which has an interval B1 being smaller (narrower) than the detection interval A1, is defined between a tip portion as the non-detection surface of the movable electrodes 9a, 9b and the fixed electrode wire portion 3a, 4a. Furthermore, the narrow interval portion 21, which has an interval B1 being smaller (narrower) than the detection interval A1, is defined between a tip portion as the non-detection surface of the fixed electrodes 3b, 4b and the weight portion 6 confronted thereto.

Furthermore, in this embodiment, the narrow interval portion having an interval narrower than any other intervals is defined between the weight portions 7a, 7b and portion confronted thereto at which is positioned in a different direction than a moving direction of the weight portions 7a, 7b, as shown in FIG. 7B. Here, the "any other intervals" includes intervals defined between each the movable electrodes 9a, 9b and the fixed electrodes 3b, 4b, adjacent and confronted each other.

As described the above, the weight portions 7a, 7b are formed in beam-shape so as to move in a direction perpendicular to a longitudinal direction of the beam (X-direction in FIG. 2). In this moving direction, an interval (movement interval) A2 is provided between the weight portions 7a, 7b and the surrounding portion 5 confronted thereto. Furthermore, an narrow interval portion 22 having an interval B2 smaller than the movement interval A2 is provided between the weight portions 7a, 7b and the surrounding portion 5 confronted thereto, where between the tip portions of the weight portions 7a, 7b as portions positioned in the different direction than the moving direction and the surrounding portion 5 confronted thereto.

According to this embodiment, each interval among the electrodes 3b, 4b, 9a, 9b and the weight portions 7a, 7b is set so as to have relations that A1>B1 and A2>B2 (e.g., A1, A2 are twice of B1, B2, respectively). In the drying step after the third etching step (release step), the etchant is not collected at the wider portions A1, A2, but moves to the narrower portions B1, B2 as the drying advances due to the capillary phenomenon, and is finally dried up at the narrower portions B1, B2.

Because the etchant is collected at the narrower interval portions B1, B2 whose area are small, it can largely reduce the total area where the surface tension is applied compared to the case the etchant is collected at the detection portions A1, A2 whose area are large.

Furthermore, a direction causing a tensile stress due to the surface tension is the longitudinal direction of each electrode 3b, 4b, 9a, 9b, and weight portions 7a, 7b, which is different from the detection direction (moving direction of the movable electrodes 9a, 9b) and the movement direction of the weight portions 7a, 7b. Therefore, a spring constant in the direction in which the tensile stress is applied of the each electrode 3b, 4b, 9a, 9b, and weight portions 7a, 7b can be easily enlarged so that the sensor, which exceeds the tensile stress, can be easily designed.

According to this embodiment, it can precisely prevent the adhesion, because the total area where the tensile stress due to the surface tension is to be applied can be largely reduced, and the spring constant of the sensor structure in the direction in which the tensile stress is to be applied can be enlarged.

Furthermore, according to this embodiment, since the detection interval A1 between the movable electrodes 9a, 9b and the fixed electrodes 3b, 4b may not become a factor of the adhesion (sticking), the sensibility of the sensor can be improved by increasing the detection area at the detection interval A1.

Here, in this embodiment, the detection interval is provided between the movable electrodes 9a, 9b and the one side of the fixed electrodes 3b, 4b, however, the detection interval can be provided between the movable electrodes and the both sides of the fixed electrode.

Here, each shapes of the narrow interval portions 20, 21, 22, and shapes of the confronted portions can be modified to enhance the effect of the narrow interval portions. FIGS. 8A through 8I show modified structures of the narrow interval portions. Here, each Figure shows the narrow interval portion 20, however, each structure can be applied to the narrow interval portions 21, 22.

Figure 8A:
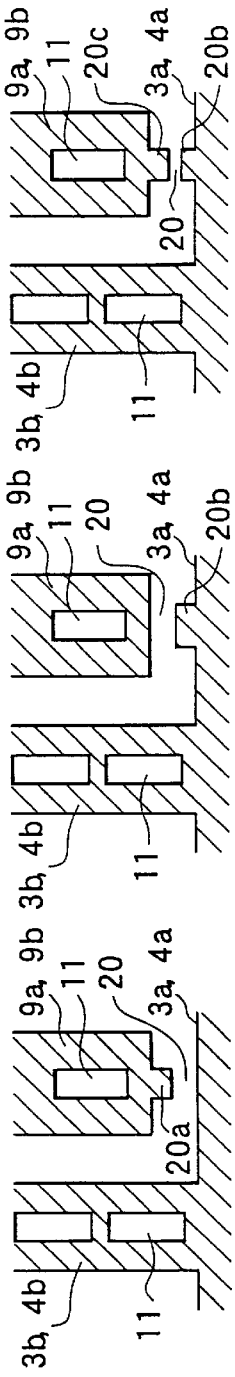
FIGS. 8A through 8I are plan views illustrating various examples of a narrow portion of the second embodiment.
Figure 8B:
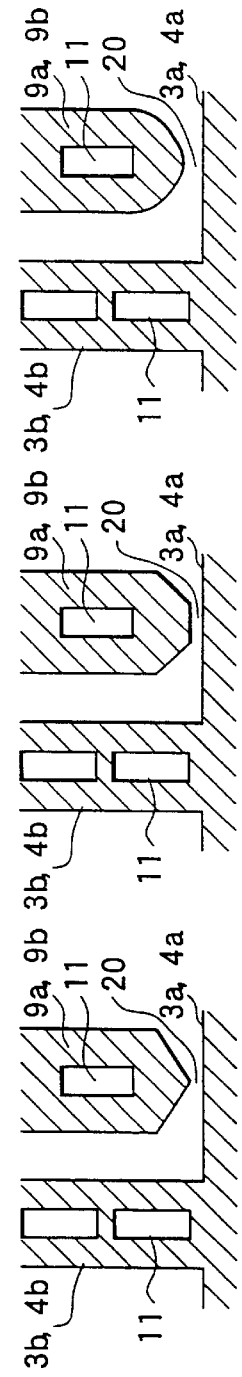

FIG. 8A shows a modification in which a projection portion 20a is formed to the tip of the movable electrodes 9a, 9b, and the interval of the narrow interval portion 20 is defined between the projection portion 20a and the confronted portion. On the contrary, FIG. 8B shows a modification in which a projection portion 20b is formed to the tip of the fixed electrodes 3a, 4a, and the interval of the narrow interval portion 20 is defined between the projection portion 20b and the confronted portion. The surface tension can be reduced by making the confront area small by forming projection portion 20a or 20b at only one side.

Figure 8C:
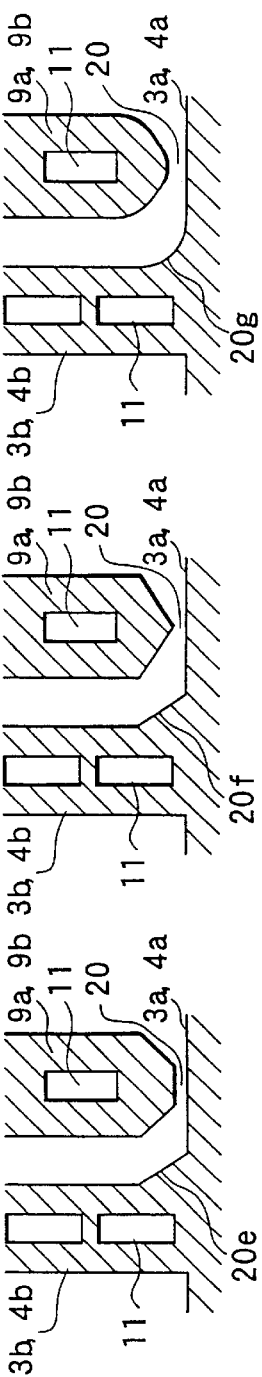

FIG. 8C shows a modification in which a pair of projection portions 20c, 20d are formed to the confronted portions (i.e., the tip of the movable electrodes 9a, 9b and the fixed electrode wire portions 3a, 4a). The interval of the narrow interval portion 20 is defined between both the projection portions 20c, 20d. The surface tension can be reduced by making the confront area further small by forming projection portions 20c and 20d at both side, respectively.

Figure 8D:
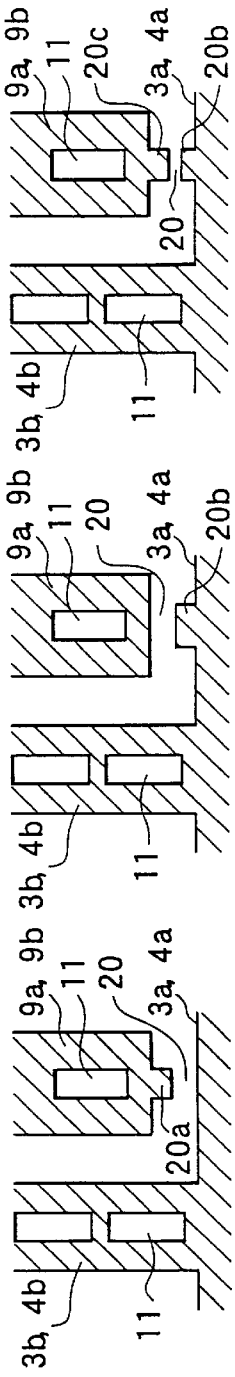

FIG. 8D shows a modification in which the tip of the movable electrode 9a, 9b are tapered (sharpened) to have tapered (sharpened) projection portion. It can achieve further smaller confront area so as to reduce the surface tension without changing widths of the movable electrodes 9a, 9b, the fixed electrodes 3b, 4b or the weight portions 7a, 7b, in other word without decreasing the rigidity, by providing the tapered tip portion to the projection portion.

Figure 8E:
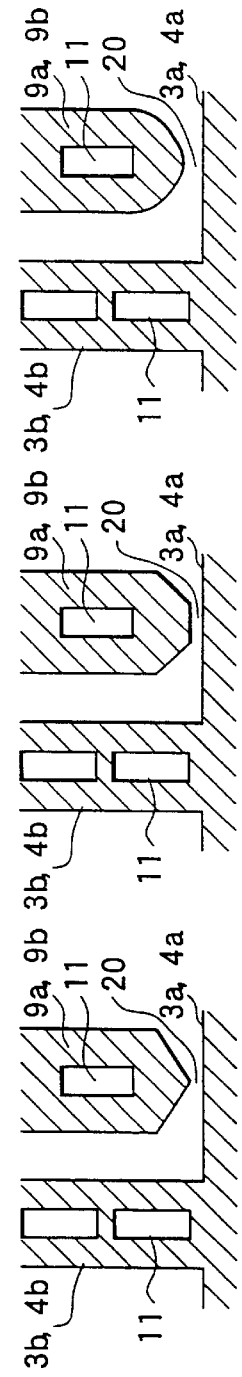

FIG. 8E shows a modification in which the tip of the tapered portion where the narrow interval portion 20 is to be defined is chamfered to have a flat surface.

Figure 8F:
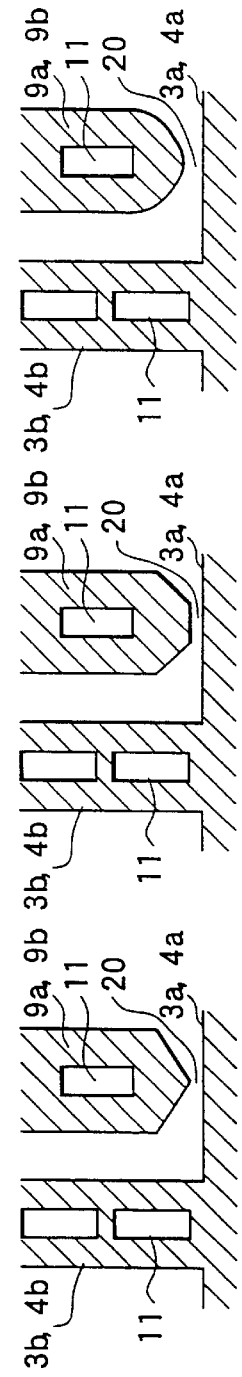

FIG. 8F shows a modification in which the tip of the tapered portion where the narrow interval portion 20 is to be defined is chamfered (round) to have a round surface. In this case, since the tip of the corner is round, the etchant can be smoothly and easily moved to the tip portion so that the tensile stress can be further prevented.

Figure 8G:
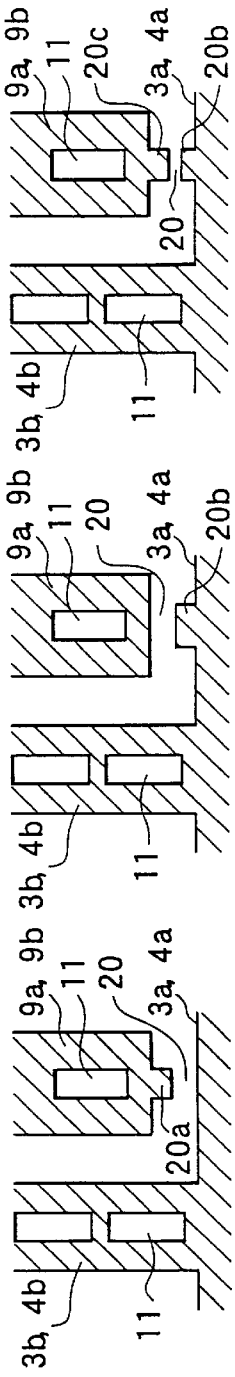
Figure 8H:
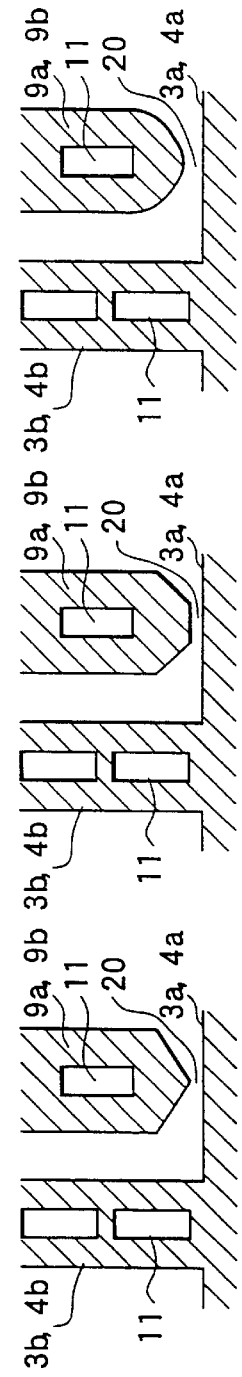
Figure 8I:
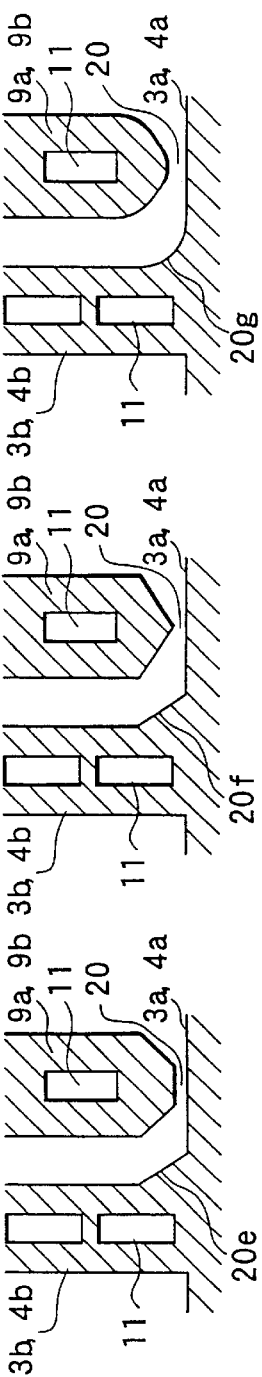

FIGS. 8G, 8H, 8I show modifications each of which has a slope surface 20e, 20f or 20g, which is formed to a portion confronted to the tip portion of the movable electrodes 9a, 9b. Each of the slope surface 20e, 20f and 20g inclines so as to approach from the surrounding portion of the tip portion to the tip portion. In this case, the etchant can be smoothly and easily moved to the tip portion so that the tensile stress can be further prevented.

Figure 9:
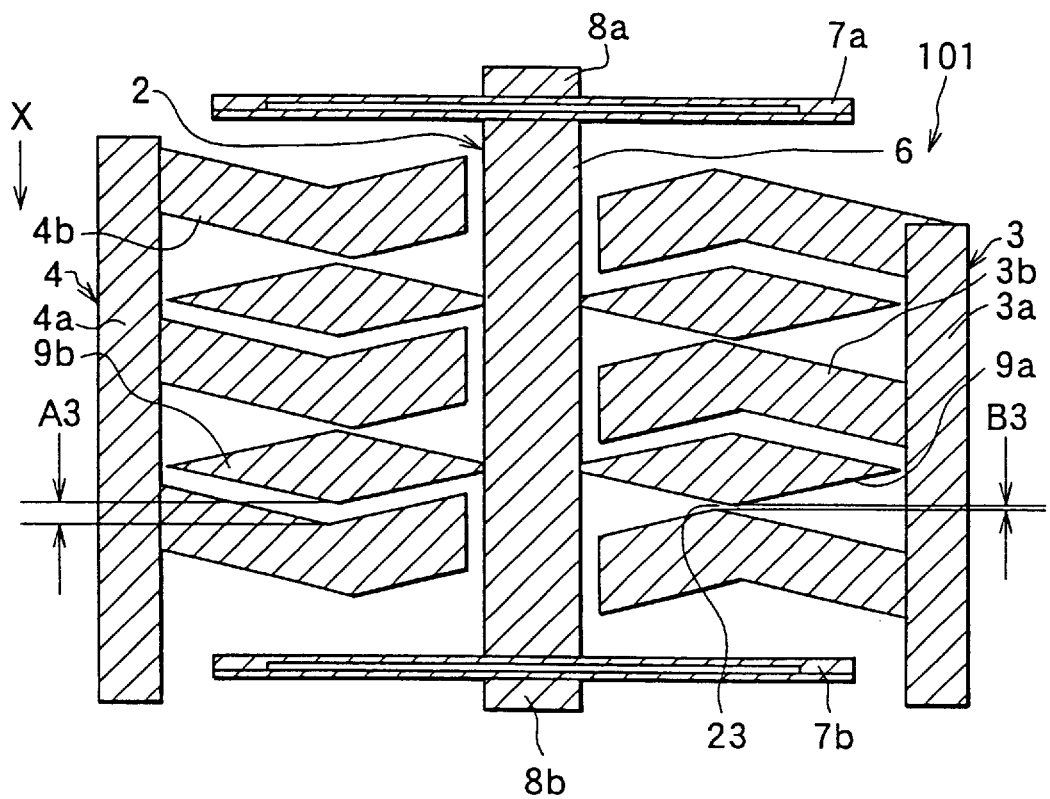
FIGS. 9, 10A, 10B are plan views of modified semiconductor acceleration sensors of the second embodiment.

FIG. 9 shows a modification of this embodiment. In this modification, the narrow interval portion 23 is defined at one part of a portion opposite to the detection interval A3 of the both electrodes 3b, 4b, 9a and 9b. The shapes of the movable electrodes 9a, 9b and the fixed electrodes 3b, 4b are changed.

As shown in FIG. 9, the movable electrodes 9a, 9b have wide portion at their central portions, that is, lozenge shapes. The fixed electrodes 3b, 4b, which confront the detection surfaces of the movable electrodes 9a, 9b, have curved (or bended) shapes to partially fit to the movable electrodes 9a, 9b so as to form the detection intervals A3.

Here, the narrow interval portion 23 is defined between both non-detection surfaces opposite to the detection interval A3, where the wide central portion of each movable electrode 9a, 9b confronts the bended portion of each fixed electrode 3b, 4b. Therefore, a confront area at the narrow interval portion 23 is much bigger than a confront area at the detection interval A3. Furthermore, the detection interval A3 and the interval of the narrow interval portion B3 have a relationship of A3>B3 (e.g., A3 is twice as B3).

By constructing this way, in the drying step, the etchant is not collected at the wider portion A3, but moves to the narrower portions B3 as the drying advances due to the capillary phenomenon, and is finally dried up at the narrower portions B3, as well as the narrow interval portions 20, 21, 22.

However, in the narrow interval portion 23, it can largely reduce the tensile stress because a total area, at which the tensile stress (X-direction in FIG. 9) is to be occurred, is largely reduced compared to the case that the etchant is dried up at the detection interval A3 having a wide area. Furthermore, a restore force of the weight portions 7a, 7b are also applied thereto, the adhesion at the narrow interval portion 23 can be prevented.

In this way, the confront area of the narrow interval portion 23, that is, an adhesion area of the non-detection surface can be largely reduced by combining the lozenge shape and the curved shape to the electrodes 3b, 4b, 9a and 9b. Furthermore, it can prevent a parasitic capacitance generated between the non-detection surfaces from increasing by being apart from the electrode intervals other than the narrow interval portion 23. At the detection surface side, it can increase an initial capacitance because the detection surfaces (capacitance forming portion) of both the electrodes are bended or widened to fit each other.

Figure 10A:
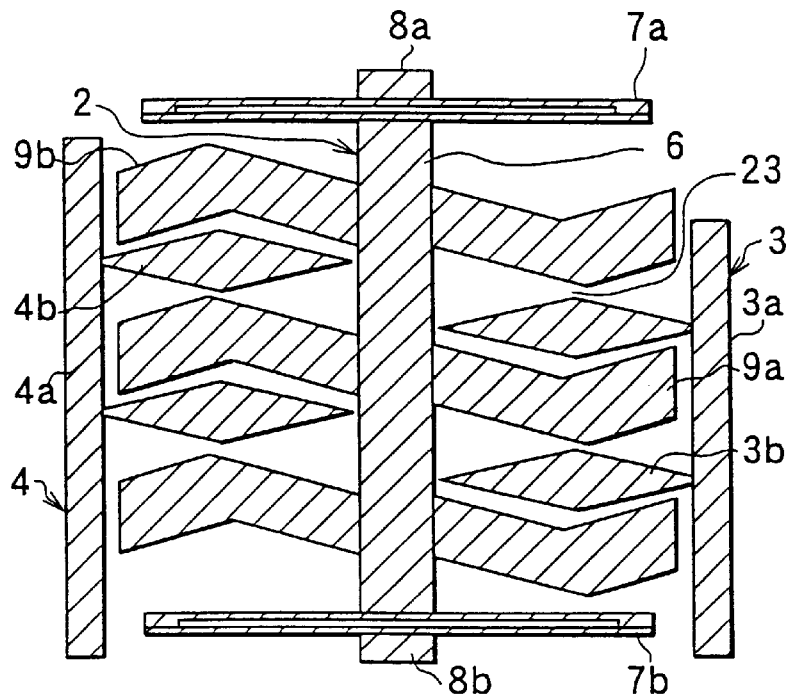

Here, in this modification shown in FIG. 9, the movable electrodes 9a, 9b are formed in lozenge shape and the fixed electrodes 3b, 4b are formed in bended shape, however, the fixed electrodes 3b, 4b may be formed in lozenge shape and the movable electrodes 9a, 9b may be formed in curved shape, on the contrary, as shown in FIG. 10A as another modification. This can achieve the same result.

Figure 10B:
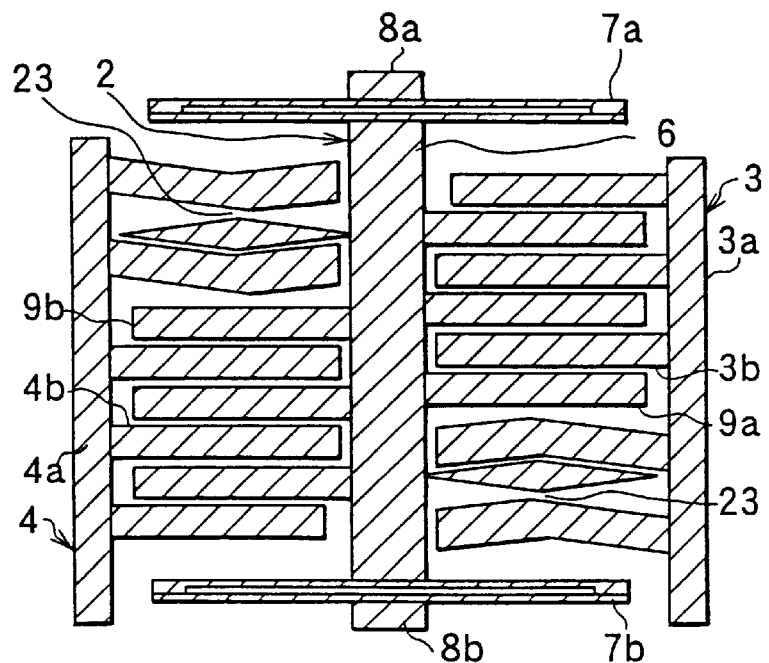

Furthermore, the combination of lozenge shape and the curved shape to the electrodes may not be applied to the all electrodes. For example, as shown in FIG. 10B, one or several pairs may be provided in a direction at which the adhesion is to be prevented. In this case, it is effective to form the combination to a portion where the etchant is likely to remain.

The narrow portion 23, which is provided at one interval opposite to the detection interval A3 among the intervals between electrodes 3b, 4b, 9a and 9b, may be formed by providing projection portions to at least one of confront surface of the electrodes 3b, 4b, 9a and 9b at where one of intervals opposite to the detection interval A3. Here, the sensor 200 of this embodiment can be manufactured by the same steps described in the first embodiment.

[Third Embodiment]

This embodiment is to prevent an adhesion of a movable portion to a fixed portion due to an excessive force being externally applied thereto.

Figure 11:
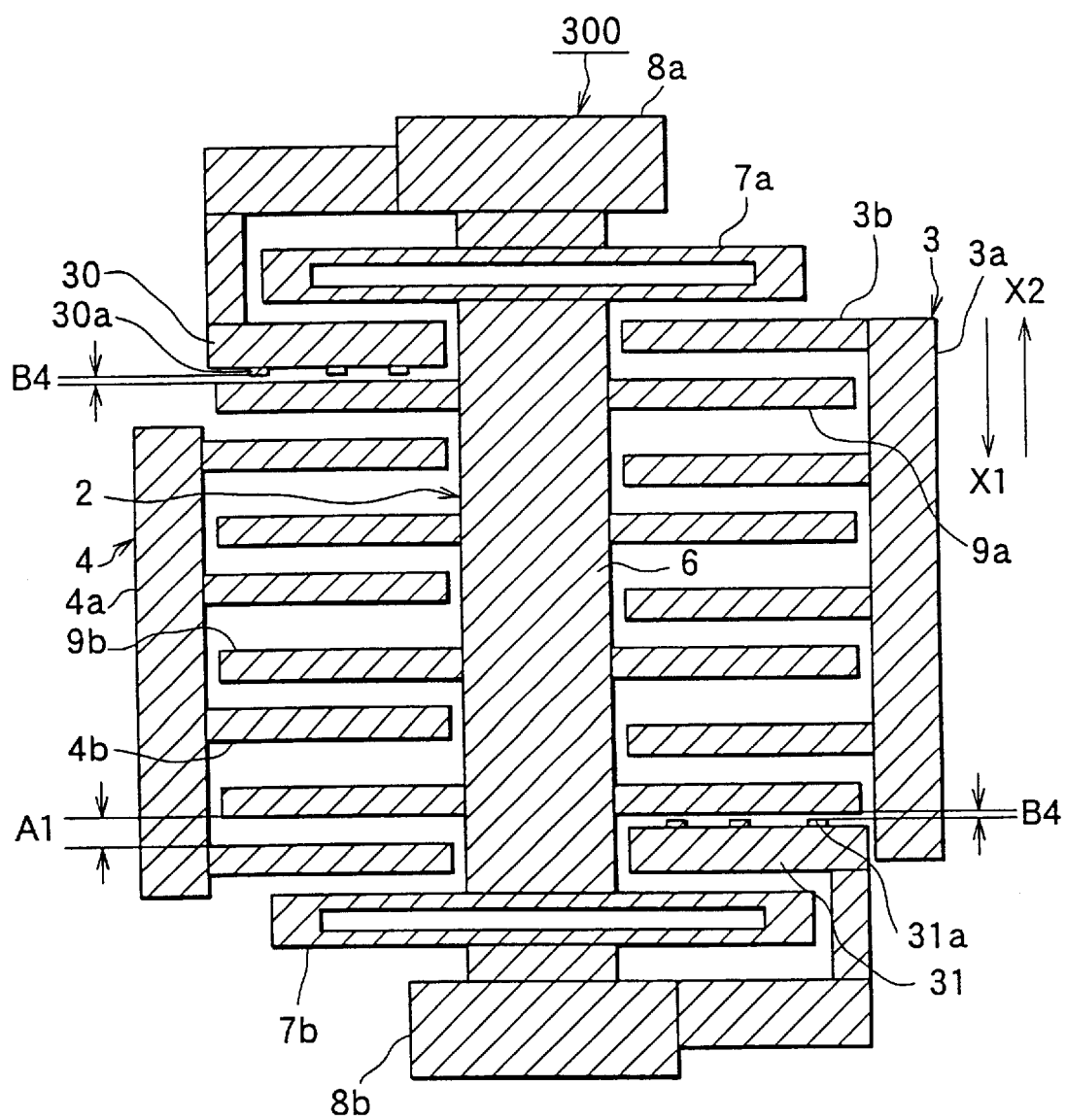
FIGS. 11 is an enlarged plan view of a semiconductor acceleration sensor of a third embodiment.

As shown in FIG. 11, the semiconductor acceleration sensor 300 of this embodiment is a modification of the first embodiment. That is, in this embodiment, the trench 103 and the handling portion surrounding the sensor portion 101 are omitted, and stoppers 30, 31 are further provided. Therefore, according to the semiconductor sensor 300 according to this embodiment, the sensor portion 101 shown in FIGS. 2, 3A and 3B is a basic structure as itself. The portions different from the first embodiment are mainly explained.

Stoppers 30, 31 are fixed to the first semiconductor layer (semiconductor substrate) 1a via the anchor portions 8a, 8b, and are electrically connected to the movable portion 2. The stoppers 30, 31 are made from the second semiconductor layer 1b, and are integrally formed with the anchor portions 8a, 8b at the trench forming step shown in FIG. 5E. The stoppers 30, 31 are formed with the each structure at this step.

The stopper 30 detours an outer side of the weight portion 7a from the anchor 8a, and confronted to the non-detection surface of the movable electrode 9a with an interval B4 smaller than the detection interval A1 interposed therebetween in the movement direction (X1 and X2 in Figure) of the movable portion 2. On the contrary, the stopper 31 detours an outer side of the weight portion 7b from the anchor 8b, and confronted to the non-detection surface of the movable electrode 9b with an interval B4 smaller than the detection interval A1 interposed therebetween in the movement direction (X1 and X2 in Figure) of the movable portion 2.

On the surfaces of each the stopper 30, 31 where the movable electrodes 9a, 9b are confronted, projection portions 30a, 31a, which are projected from the confronted surfaces to the movable electrodes 9a, 9b, are provided. These stoppers 30, 31 are to prevent the adhesion of each electrodes 3b, 4b, 9a, 9b among the detection interval A1 when the excessive shock (acceleration) is externally applied to the semiconductor sensor, and operate as follows.

When the excessive acceleration is externally applied thereto in the X1-direction, the movable portion 2 stops by colliding with the stopper 31, while when the excessive acceleration is externally applied thereto in the X2-direction, the movable portion 2 stops by colliding with the stopper 30. Therefore, each the electrode 3b, 4b, 9a, 9b do not contact each other among the detection interval A1 so that the adhesion can be prevented.

Here, since the stoppers 30, 31 have the projection portions 30a, 31a at their surfaces confronted to the movable electrodes 9a, 9b, the confront area between the movable electrodes 9a, 9b can be reduced. Therefore, a contact force due to the adhesion between the stoppers 30, 31 and the movable electrodes 9a, 9b becomes so small that the adhered portion can be released by the restoring force of the weight portions 7a, 7b.

Furthermore, since the stoppers 30, 31 are electrically connected to the movable electrodes 9a, 9b via the anchor portions 8a, 8b, both portions 30, 9a, 31, 9b are set to the same potentials so that it can prevent the tensile stress due to the electrostatic force from generation. In this embodiment, since the stoppers 30, 31 are confronted to ones of the movable portions 9a, 9b, where position at the end of the movable electrodes 9a, 9b, the stoppers 30, 31 can be connected to the anchor portions 8a, 8b without spanning on the other movable electrodes 9a, 9b and the fixed electrodes 3b, 4b so that the wire structure can be simple.

Here, one of the stoppers 30, 31 may be omitted. That is, it is acceptable to form only one of the stoppers 30, 31. Furthermore, it is acceptable to form the projection portions 30a, 31a only one of the stoppers 30, 31.

[Fourth Embodiment]

This embodiment is to prevent an adhesion of a movable portion 2 to a fixed portion due to a surface tension of fluid during manufacturing the semiconductor physical quantity sensor. The semiconductor acceleration sensors 100, 200, 300 as described in each embodiment can be manufactured by the manufacturing steps shown in FIG. 5A through 5H.

Here, after forming the structure 110 in which the movable portion 2 and the fixed electrode structures 3, 4 are released each other at the third etching step (release step), the evaporating step for washing the structure using rinse (generally, ultrapure water), drying, and evaporating the rinse is performed. In this evaporating step, when the liquid (rinse) remains between the fixed electrodes 3b, 4b and the movable electrodes 9a, 9b, for instance, an tensile stress is likely to occur between both the electrodes due to the surface tension as the evaporation of the liquid advances so that the adhesion may be occur after drying up.

However, in this embodiment, the evaporating step of the first embodiment is modified as follows. That is, after etching by the HF solution (third etching step), the structure 110 is well rinsed by ultrapure water. After that, the structure 110 is soaked in alcohol (substitute liquid) to substitute the etchant with the liquid so that the liquid (ultrapure water) does not remain on the electrodes and the like.

After that, the alcohol is dried up by heating the alcohol before taking out the structure 110 and then taking out the structure 110 to dry up at room temperature, or by heating the structure 110 after being taken out from the alcohol. Here, both of these drying up step may be performed.

The surface tension decreases as the temperature of the liquid rises. For example, in the case of water, the surface tension at 100° C. is smaller than that at room temperature by about 20%. Therefore, the tensile stress due to the surface tension can be reduced by heating the liquid or the structure as described the above, because the temperature of the liquid remained on the structure 110 rises during the drying up (evaporating).

Since an alcohol has a small surface tension as one-third to one-fourth as that of ultrapure water, the tensile stress can reduce. Furthermore, an alcohol can easily applied to the manufacturing steps because an alcohol has characteristics such that it can be easily dissolved to the water and can be easily substituted, and that high purity alcohol for semiconductor fabrication can be easily obtained. The alcohol is exemplified ethyl alcohol, methyl alcohol, and isopropylene alcohol. Here, the ultrapure water may be used instead of the alcohol.

According to this embodiment, the surface tension of the liquid can be reduced compared to the drying up at the room temperature at the evaporating step so that the adhesion (sticking) can be prevented. This embodiment can be applied to the other semiconductor physical quantity sensor other than the sensor described the above, such as yaw rate sensor.

[Fifth Embodiment]

Figure 12A:
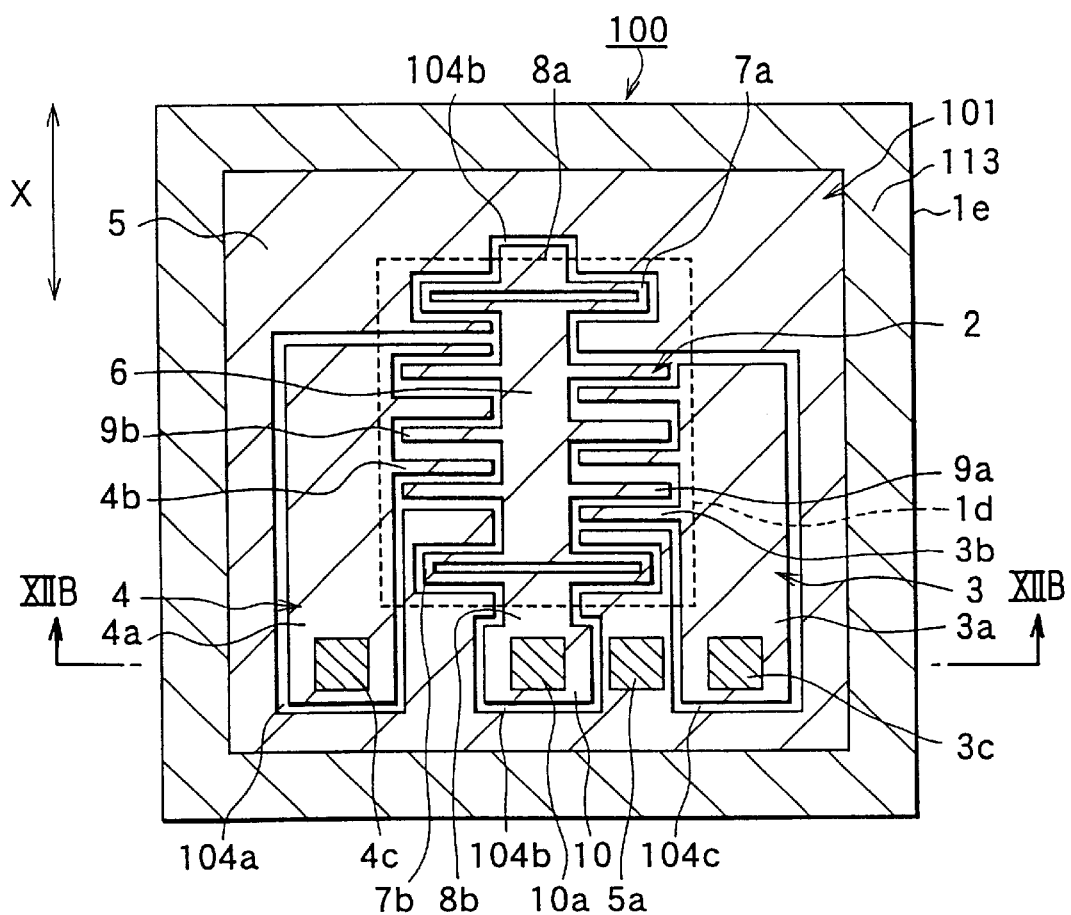
FIG. 12A is a plan view of a semiconductor acceleration sensor of a fifth embodiment according to the present invention.
Figure 12B:
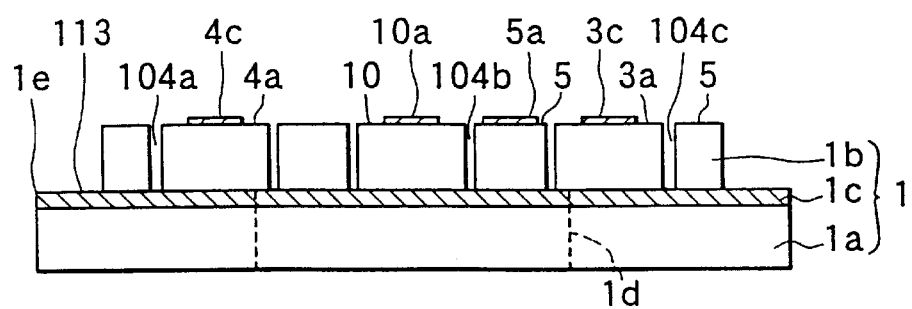
FIG. 12B is a sectional view taken along a line XIIB—XIIB in FIG. 12A.

This embodiment is a modification of the first embodiment, that is, the handling portion is modified. The portions different from the first embodiment are mainly explained. FIG. 12A is a plan view of a semiconductor acceleration sensor 100, and FIG. 12B is a sectional view taken along a line XIIB—XIIB in FIG. 12A.

In this embodiment, in the structure in which the second semiconductor layer 1b is formed on the first semiconductor layer 1a as the semiconductor substrate with the insulation layer 1c interposed therebetween, the sensor portion 101 is formed by the second semiconductor layer 1b and the insulation layer 1c is exposed by removing the second semiconductor layer 1b positioned at outer side of the sensor portion 101. Furthermore, a frame shape portion at which the insulation layer 1c is exposed is defined as a peripheral removing portion 113, and a peripheral end surface 1e of the peripheral removing portion 113 is defined as the handling portion.

According to this embodiment, since the peripheral end surface 1e of the peripheral removing portion 113 is defined as the handling portion, the second semiconductor layer 1b constructing the sensor portion 101 is, as a result, electrically insulated from the handling portion 1e by the insulation layer 1c as the insulation portion. The peripheral removing portion 113 is formed by removing the second semiconductor layer 1b at the same time at the trench forming step shown in FIG. 5E.

Therefore, the handling portion 1e can be easily formed as well as the first embodiment so that it can prevent the sensor portion 101 from being charged and that it can prevent the adhesion due to the electrostatic force generated during the handling. Here, in this embodiment, the peripheral removing portion 113 is formed at the whole peripheral portion of the sensor portion 101 so that the peripheral end surface 1e of the peripheral removing portion 113 is defined as the handling portion, however, the peripheral removing portion 113 may be arranged at opposite two sides at the surrounding portion of the sensor portion 101.

Here, the semiconductor acceleration sensor 100 is formed to chips by dicing cut. According to this embodiment, since there is not the second semiconductor layer 1b on a region to be scribed, scraps of the second semiconductor layer 1b are not generated during the cutting. These scraps of the second semiconductor layer 1b may cause short-circuit when they adhere to the movable electrode, for instance. However, such an inconvenience does not occur in this embodiment because the sensor is cut from the surface of the insulation layer 1c.

Figure 13A:
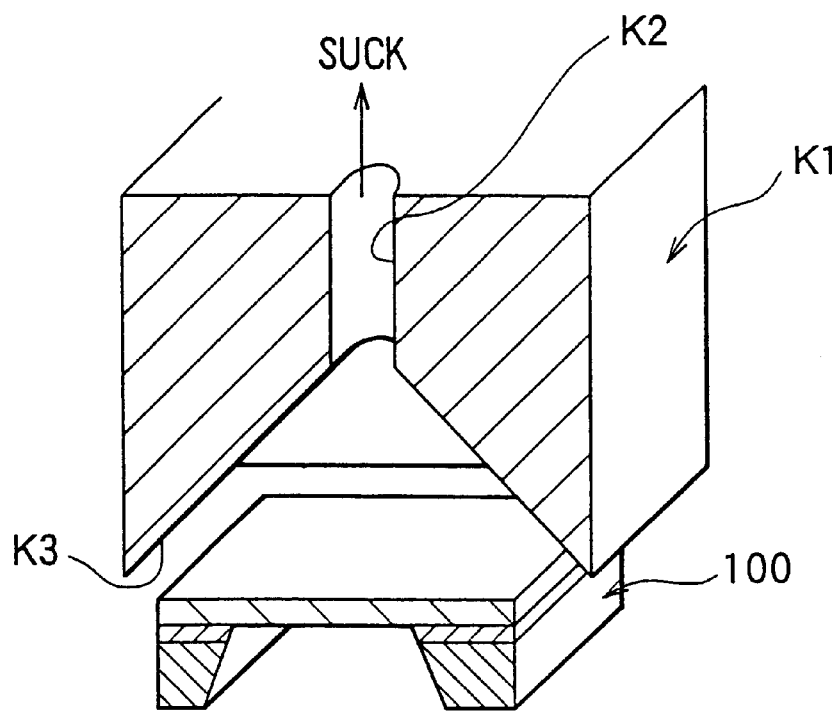
FIGS. 13A and 13B are diagrams illustrating a handling using a pyramid type collet.
Figure 13B:
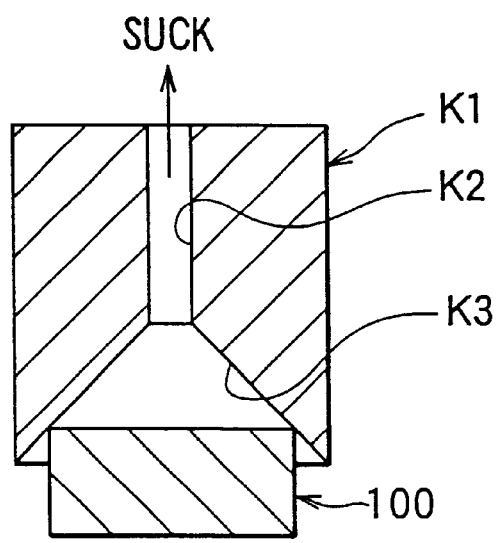

The chipped sensor chip (semiconductor acceleration sensor) 100 is handled by using a pyramid type collet K1 as shown in FIG. 13A. FIGS. 13A and 13B are diagrams illustrating a handling using a pyramid type collet. The hatched portion is a section. The collet K1 is an apparatus to adhere (stick) the outer portion of the sensor chip 100 onto a tapered surface K3 by vacuum-sucking through a hole K2.

Figure 14A:
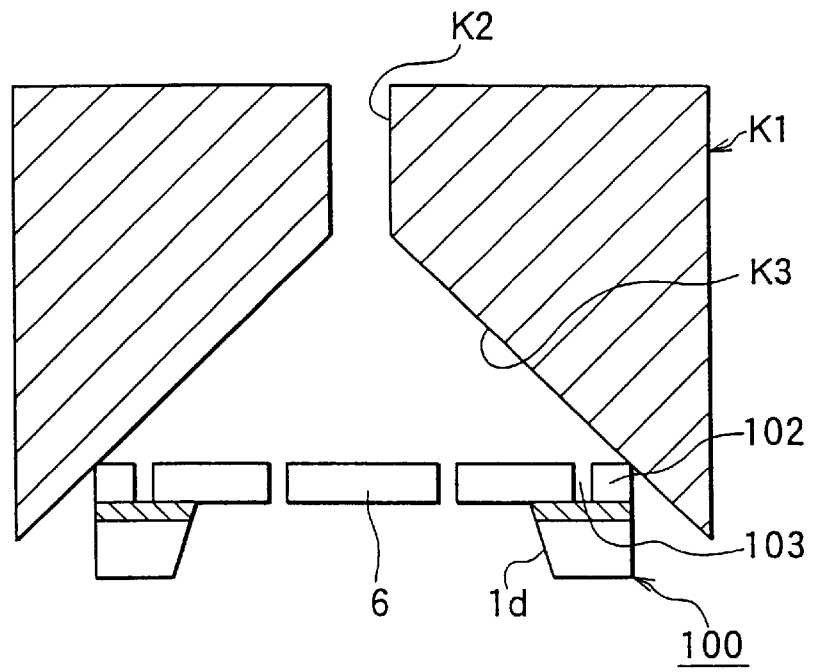
FIGS. 14A and 14B are diagrams illustrating an effect of the fifth embodiment.
Figure 14B:
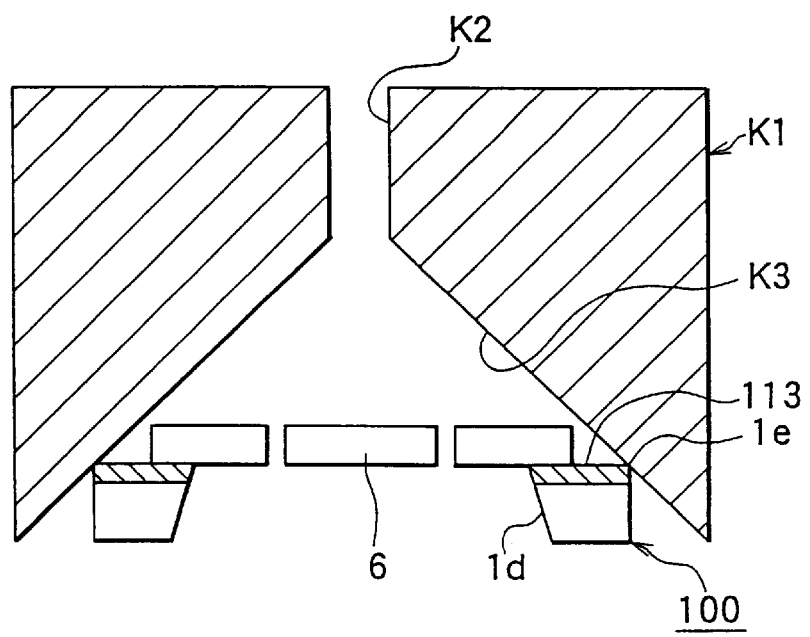

FIGS. 14A and 14B are diagrams illustrating an effect of this embodiment in which the sensor ship 100 is handled by using the collet K1. Here, FIG. 14A is for first embodiment, and FIG. 14B is for this embodiment. Both Figures shows a relationship between the collet K1 and the sensor ship 100 as a schematic sectional view. As shown in FIG. 14A, the handling portion 102 provided at surrounding portion of the sensor portion (outer peripheral portion of the sensor ship) is contacted with the tapered surface K3 of the collet K1. On the contrary, as shown in FIG. 14B, the peripheral end surface 1e of the peripheral removing portion 113 provided at surrounding portion of the sensor portion (outer peripheral portion of the sensor ship) is contacted with the tapered surface K3 of the collet K1.

In the case of the former case, the handling portion 102 is constructed in a form of projection by providing the trench 103 at the surrounding portion of the sensor portion 101. On the contrary, in the case of the later case, the handling portion 102 is constructed as the outer peripheral portion of the insulation layer 1c having a substantially flat surface. Therefore, when a press force of the tapered surface K3 of the collet K1 is taken into consideration, a mechanical durability of the handling portion 1e of this embodiment is relatively large compared to that of the first embodiment. Furthermore, according to this embodiment, the sensor portion 101 can be certainly electrically insulated from the handling portion 1e by forming the peripheral removing portion 113.

[Other Modifications]

In the second and the third embodiments, the trench 103 and the handling portion 102 shown in the first embodiment may be provided to the each sensor 200, 300. This invention can be applied to other semiconductor physical quantity sensor having the movable portion and the fixed portion, for example, an angular velocity sensor or the like other than the semiconductor acceleration sensor.

What is claimed is:

1. A semiconductor physical quantity sensor comprising:
a sensor portion including:
a semiconductor substrate;
a movable portion having a weight portion supported to the semiconductor substrate, for moving in accordance with a physical quantity applied thereto; and an movable electrode integrally formed with the weight portion and having a detection surface; and
a fixed electrode supported to the semiconductor substrate, and having a detection surface confronted to the detection surface of the movable electrode; and
a handling portion formed on the semiconductor substrate, being insulated from the sensor portion by an insulation portion, and is to be externally contacted when the semiconductor physical quantity sensor is handled.

2. A sensor according to claim 1, wherein said sensor portion has a surrounding portion and the handling portion is formed at said surrounding portion of the sensor portion with the insulation portion interposed therebetween.

3. A sensor according to claim 1, wherein said sensor portion has a whole surrounding portion and the handling portion is formed at the whole surrounding portion of the sensor portion with the insulation portion interposed therebetween.

4. A sensor according to claim 1, wherein:
said semiconductor substrate has at least one surface, and
a semiconductor layer is provided on said at least one surface of the semiconductor substrate,
the insulation portion has a trench to divide the semiconductor layer, and
the sensor portion and the handling portion are made from the semiconductor layer with the trench interposed therebetween, and electrically insulated each other by the trench.

5. A sensor according to claim 1, wherein:
said semiconductor substrate has at least one surface,
a semiconductor layer is provided on said at least one surface of the semiconductor substrate with an insulation layer interposed therebetween and being on an outer side of the sensor portion,
the sensor portion is made from the semiconductor layer,
the insulation layer on said outer side of the sensor portion is partially exposed by partial removal of the semiconductor layer,
the exposed insulation layer has a peripheral end portion, and
the handling portion is defined by the peripheral end portion of the insulation layer.

* * * * *

UNITED STATES PATENT AND TRADEMARK OFFICE
CERTIFICATE OF CORRECTION

PATENT NO.     : 6,276,207 B1
DATED          : August 21, 2001
INVENTOR(S)    : Sakai et al.

It is certified that error appears in the above-identified patent and that said Letters Patent is hereby corrected as shown below:

<u>Title page,</u>
Item [12], please change "[12] Sakai et al." to -- [12] Takeuchi et al. --

Item [75], Inventors, please delete:
"Minekazu Sakai, Inao Toyoda, Seiichiro Ishio, Toshimasa Yamamoto, Eishi Kawasaki, Hiroshi Muto"

Signed and Sealed this

Fifteenth Day of October, 2002

*Attest:*

JAMES E. ROGAN
*Attesting Officer*           *Director of the United States Patent and Trademark Office*